(12) United States Patent
Chang et al.

(10) Patent No.: US 12,580,574 B1
(45) Date of Patent: Mar. 17, 2026

(54) CLOCK DATA RECOVERY LINEARITY IMPROVEMENT

(71) Applicant: QUALCOMM Incorporated, San Diego, CA (US)

(72) Inventors: Chia Heng Chang, San Diego, CA (US); Zhi Zhu, San Diego, CA (US); Russell Deans, Pittsboro, NC (US)

(73) Assignee: QUALCOMM INCORPORATED, San Diego, CA (US)

( * ) Notice: Subject to any disclaimer, the term of this patent is extended or adjusted under 35 U.S.C. 154(b) by 11 days.

(21) Appl. No.: 18/818,004

(22) Filed: Aug. 28, 2024

(51) Int. Cl.
*H03L 7/099* (2006.01)
*H03L 7/089* (2006.01)
*H03L 7/091* (2006.01)

(52) U.S. Cl.
CPC ............ *H03L 7/0998* (2013.01); *H03L 7/089* (2013.01); *H03L 7/091* (2013.01)

(58) Field of Classification Search
CPC ........ H03L 7/0998; H03L 7/089; H03L 7/091
See application file for complete search history.

(56) References Cited

U.S. PATENT DOCUMENTS 7,099,424 B1 * 8/2006 Chang ................... H03L 7/0814
327/284
9,413,524 B1 8/2016 Xu et al.

10,084,621 B2 9/2018 Song et al.
10,916,409 B2 * 2/2021 Marakhtanov .... H01L 21/67069
2005/0069071 A1 * 3/2005 Kim ........................ H03L 7/091
375/355
2006/0076993 A1 4/2006 Teo et al.
2019/0288830 A1 9/2019 Zhuang et al.
2024/0137056 A1 * 4/2024 Pfeffer .................... G01S 7/032
2024/0305306 A1 * 9/2024 Liu ........................ H03L 7/0998

FOREIGN PATENT DOCUMENTS

WO 2018144207 A1 8/2018

OTHER PUBLICATIONS

International Search Report and Written Opinion PCT/US2025/038670 ISA/EPO Nov. 12, 2025.

* cited by examiner

*Primary Examiner* — Janice N Tieu
(74) *Attorney, Agent, or Firm* — Loza & Loza, LLP

(57) ABSTRACT

A method for phase adjustment includes receiving a phase control signal for a phase interpolator, determining the phase control signal is located within one of first phase zones, and adjusting the phase control signal by a first step size upon determining the phase control signal is located within one of the first phase zones. The method also includes determining the phase control signal is located within one of second phase zones, and adjusting the phase control signal by a second step size larger than the first step size upon determining the phase control signal is located within one of the second phase zones.

20 Claims, 12 Drawing Sheets

610

CLOCK DATA RECOVERY LINEARITY IMPROVEMENT

BACKGROUND

Field

Aspects of the present disclosure relate generally to clock data recovery (CDR), and, more particularly, to CDR linearity improvement.

Background

In serial communication, a system receives a serial data signal via a serial link. The system may include a data sampler and a clock data recovery (CDR) circuit. The data sampler converts the serial data signal into serial data bits by sampling the serial data signal on edges of a clock signal. The CDR circuit extracts timing information from the output of the data sampler and adjusts the phase of the clock signal based on the timing information to enable the data sampler to correctly sample the serial data signal.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a phase control circuit having an input and an output, wherein the phase control circuit is configured to output a phase control signal at the output of the phase control circuit, and a phase interpolator coupled to the output of the phase control circuit. The system also includes a step-size selection circuit configured to receive a first phase adjustment signal having a first step size, a second phase adjustment signal having a second step size larger than the first step size, and the phase control signal. The step-size selection circuit is configured to output the first phase adjustment signal to the input of the phase control circuit if the phase control signal is located within one of first phase zones, and output the second phase adjustment signal to the input of the phase control circuit if the phase control signal is located within one of second phase zones.

A second aspect relates to a method for phase adjustment. The method includes receiving a phase control signal for a phase interpolator, determining the phase control signal is located within one of first phase zones, and adjusting the phase control signal by a first step size upon determining the phase control signal is located within one of the first phase zones. The method also includes determining the phase control signal is located within one of second phase zones, and adjusting the phase control signal by a second step size larger than the first step size upon determining the phase control signal is located within one of the second phase zones.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
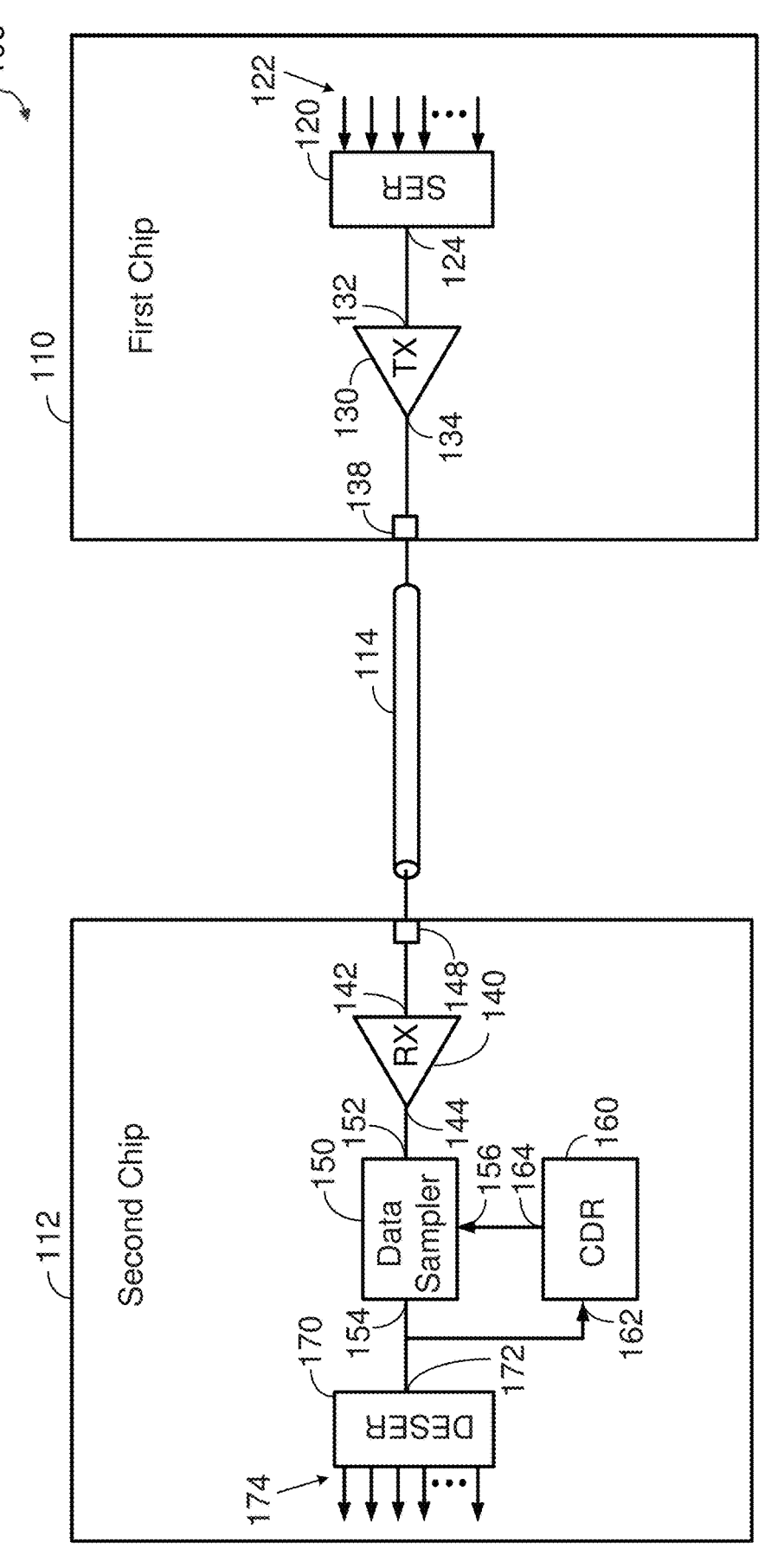
FIG. 1 shows an example of a system including a first chip and a second chip in which the first chip is configured to transmit a serial data signal to the second chip via a serial link according to certain aspects of the present disclosure.

FIG. 1 shows an example of a system 100 including a first chip 110 and a second chip 112, in which the first chip 110 and the second chip 112 communicate with each other using serializer/deserializer (SerDes). The first chip 110 and the second chip 112 may be packaged together or packaged separately. In the example shown in FIG. 1, the first chip 110 includes a serializer 120 and a driver 130, and the second chip 112 includes a receiver 140, a data sampler 150, a clock data recovery (CDR) circuit 160, and a deserializer 170. It is to be appreciated that each of the chips 110 and 112 includes additional circuits (e.g., one or more processors) not shown in FIG. 1.

In this example, the system 100 includes a serial link 114 (e.g., a high-speed serial link) coupled between the first chip 110 and the second chip 112. As discussed further below, the serial link 114 is used for transporting a serial data signal from the first chip 110 to the second chip 112. The serial link 114 may be a differential serial link or a single-ended serial link. In certain aspects, the first chip 110 and the second chip 112 may be mounted on a substrate (e.g., a package substrate, a printed circuit board (PCB), or the like) in which the serial link 114 may include one or more metal traces on and/or embedded in the substrate. However, it is to be appreciated that the present disclosure is not limited to this example.

In the example shown in FIG. 1, the serializer 120 has multiple parallel inputs 122 and an output 124, and the driver 130 has an input 132 coupled to the output 124 of the serializer 120 and an output 134. The output 134 of the driver 130 may be coupled to the serial link 114 via one or more pads 138 on the first chip 110. A pad may also be referred to as a pin or another term.

In the example in FIG. 1, the receiver 140 has an input 142 coupled to the serial link 114 and an output 144. The input 142 of the receiver 140 may be coupled to the serial link 114 via one or more pads 148 on the second chip 112. The data sampler 150 has a data input 152 coupled to the output 144 of the receiver 140, a clock input 156, and an output 154. The CDR circuit 160 has an input 162 coupled to the output 154 of the data sampler 150 and an output 164 coupled to the clock input 156 of the data sampler 150. The deserializer 170 has an input 172 coupled to the output 154 of the data sampler 150 and multiple parallel outputs 174.

During operation, the serializer 120 is configured to receive parallel data at the parallel inputs 122 (e.g., from a processor on the first chip 110), convert the parallel data into serial data bits, and output the serial data bits at the output 124. The driver 130 is configured to receive the serial data bits at the input 132 and transmit the serial data bits as a serial data signal to the second chip 112 via the serial link 114. In this example, the magnitude and/or polarity of the serial data signal may represent bit values.

At the second chip 112, the receiver 140 is configured to receive the serial data signal at the input 142 via the serial link 114, and output the received serial data signal at the output 144. In some implementations, the receiver 140 may include an equalizer to compensate for frequency-dependent signal attenuation in the serial link 114. The data sampler 150 is configured to receive the serial data signal at the data input 152, receive a clock signal at the clock input 156, sample the serial data signal based on the clock signal to recover the serial data bits, and output the serial data bits at the output 154. For example, the data sampler 150 may be configured to sample the serial data signal on rising edges of the clock signal, falling edges of the clock signal, or both rising and falling edges of the clock signal. The clock signal may also be referred to as a sampling clock signal since the data sampler 150 uses the clock signal to sample the serial data signal.

The deserializer 170 is configured to receive the serial data bits at the input 172 and output the data bits in parallel at the parallel outputs 174. For example, the deserializer 170 may output the data bits in parallel to a processor (not shown) on the second chip 112 for further processing. The CDR circuit 160 is configured to extract timing information from the output 154 of the data sampler 150 and adjust the phase of the clock signal based on the timing information to enable the data sampler 150 to correctly sample the serial data signal.

It is to be appreciated that the present disclosure is not limited to the exemplary circuits shown in FIG. 1. For example, it is to be appreciated that the second chip 112 may include one or more additional circuits in the receive data path not shown in FIG. 1.

Figure 2:
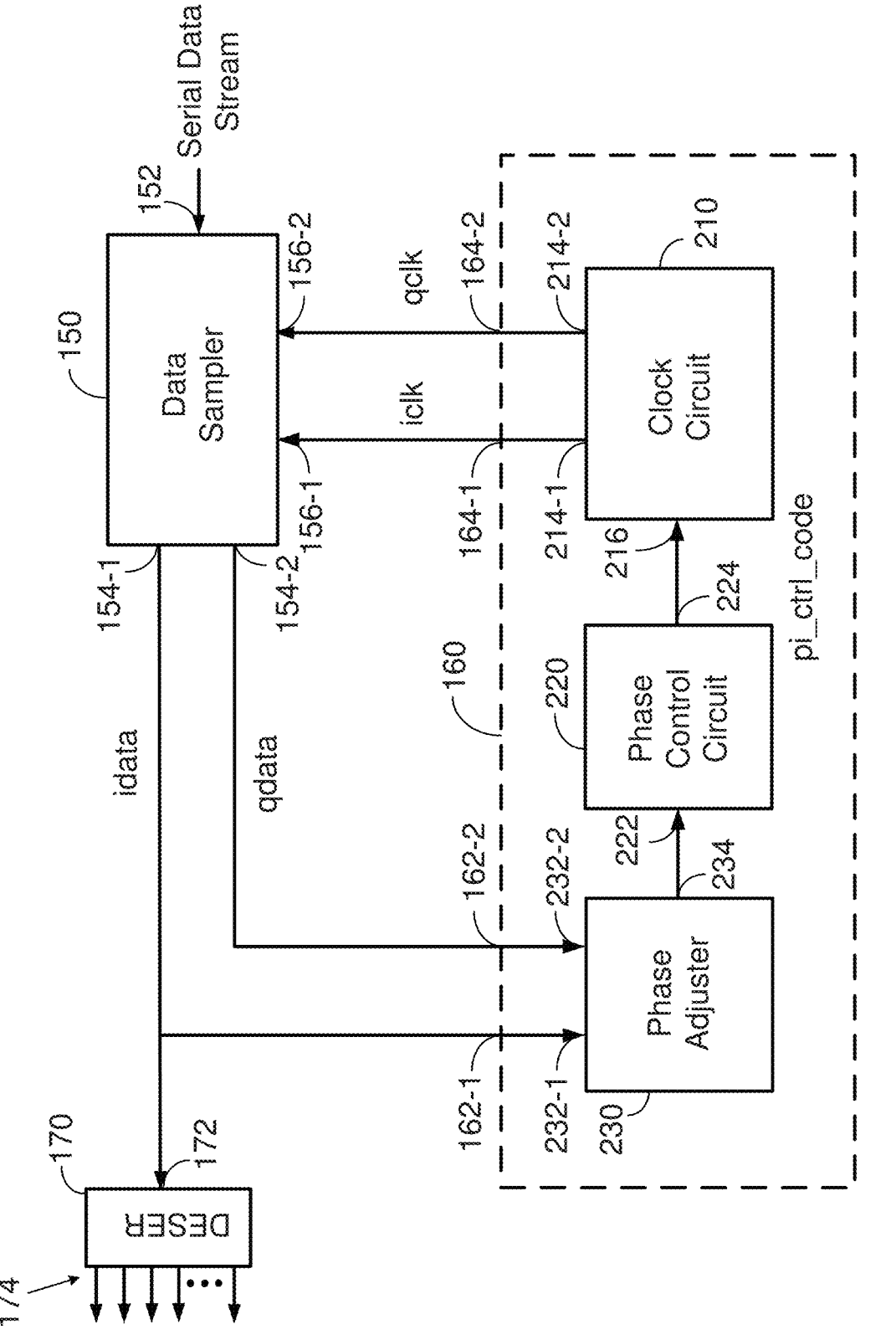
FIG. 2 shows an example of a clock data recovery (CDR) circuit according to certain aspects of the present disclosure.

FIG. 2 shows an exemplary implementation of the CDR circuit 160 according to certain aspects. In this example, the CDR circuit 160 includes a clock circuit 210, a phase control circuit 220, and a phase adjuster 230.

The clock circuit 210 is configured to generate a first clock signal iclk and a second clock signal qclk that is 90 degrees out of phase with the first clock signal iclk. As discussed further below, the first clock signal iclk may be used for data sampling to recover data bits from the serial data signal and the second clock signal qclk may be used for data transition sampling. The clock circuit 210 outputs the first clock signal iclk at a first output 214-1 and outputs the second clock signal qclk at a second output 214-2. In this example, the output 164 of the CDR circuit 160 in FIG. 1 includes a first output 164-1 for outputting the first clock signal iclk and a second output 164-2 for outputting the second clock signal qclk.

The clock circuit 210 is also configured to receive a phase control signal from the phase control circuit 220 at a control input 216 and set the phase of the first clock signal iclk based on the phase control signal. In certain aspects, the phase control signal may include a digital phase control code pi_ctrl_code indicating a phase for the first clock signal ickl. In this example, the clock circuit 210 sets the phase of the first clock signal iclk based on the phase control code pi_ctrl_code. The clock circuit 210 may also set the phase of the second clock signal qclk to a phase that is shifted 90 degrees from the phase of the first clock signal iclk. The 90-degree phase shift may be positive or negative.

In the example in FIG. 2, the clock input 156 of the data sampler 150 includes a first clock input 156-1 for receiving the first clock signal iclk and a second clock input 156-2 for receiving the second clock signal qclk. In this example, the data sampler 150 is configured to sample the serial data signal on rising and falling edges of the first clock signal iclk to generate a first output signal idata. The first output signal idata provides the serial data bits to the deserializer 170 discussed above.

The data sampler 150 is also configured to sample the serial data signal on rising and falling edges of the second clock signal qclk to generate a second output signal qdata. As discussed further below, the second output signal qdata provides timing information for data transitions in the serial data signal. In this example, the output 154 of the data sampler 150 includes a first output 154-1 for outputting the first output signal idata and a second output 154-2 for outputting the second output signal qdata. As discussed further below, the CDR circuit 160 uses the output signals idata and qdata for adjusting the phase of the first clock signal iclk in order to move the edges of the first clock signal iclk to optimal sampling positions for data sampling.

In the example in FIG. 2, the input 162 of the CDR circuit 160 includes a first input 162-1 and a second input 162-2. The first input 162-1 is coupled to the first output 154-1 of the data sampler 150 for receiving the first output signal idata and the second input 162-2 is coupled to the second output 154-2 for receiving the second output signal qdata. In this example, the phase adjuster 230 receives the first output signal idata via a first input 232-1 and receives the second output signal qdata via a second input 232-2. The phase adjuster 230 is configured to generate a phase adjustment signal based on the output signals idata and qdata and output the phase adjustment signal to the phase control circuit 220 via an output 234. The phase control circuit 220 is configured to receive the phase adjustment signal via an input 222 and update the phase control signal (e.g., the phase control code pi_ctrl_code) based on the phase adjustment signal.

Figure 3A:
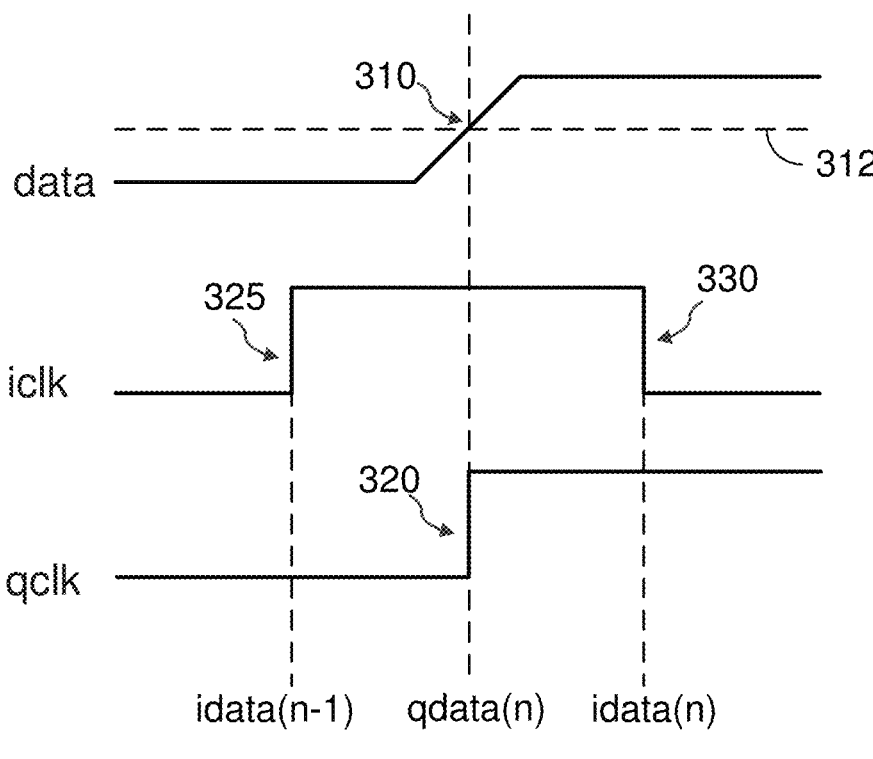
FIG. 3A is a timing diagram illustrating an example of a serial data signal, a first clock signal, and a second clock signal according to certain aspects of the present disclosure.

In certain aspects, the phase adjuster 230 is configured to generate the phase adjustment signal based on the current sample idata(n) and the previous sample idata(n−1) in the first output signal idata and the current sample qdata(n) in the second output signal qdata. In this regard, FIG. 3A shows a timing diagram illustrating an example of the samples idata(n), qdata(n), and idata(n−1) in relation to the serial data signal, the first clock signal iclk, and the second clock signal qclk. In this example, the data sampler 150 samples the serial data signal at the edge 325 of the first clock signal iclk to generate the previous sample idata(n−1), samples the serial data signal at the edge 320 of the second clock signal qclk to generate the current sample qdata(n), and samples the serial data signal at the edge 330 of the first clock signal iclk to generate the current sample idata(n).

In this example, the data sampler 150 may use the exemplary threshold level 312 shown in FIG. 3A to make a bit decision for a sample. For example, the data sampler 150 may make a bit decision of one if the serial data signal is above the threshold 312 and make a bit decision of zero if the serial data signal is below the threshold 312. However, it is to be appreciated that the data sampler 150 is not limited to this example.

Figure 3B:
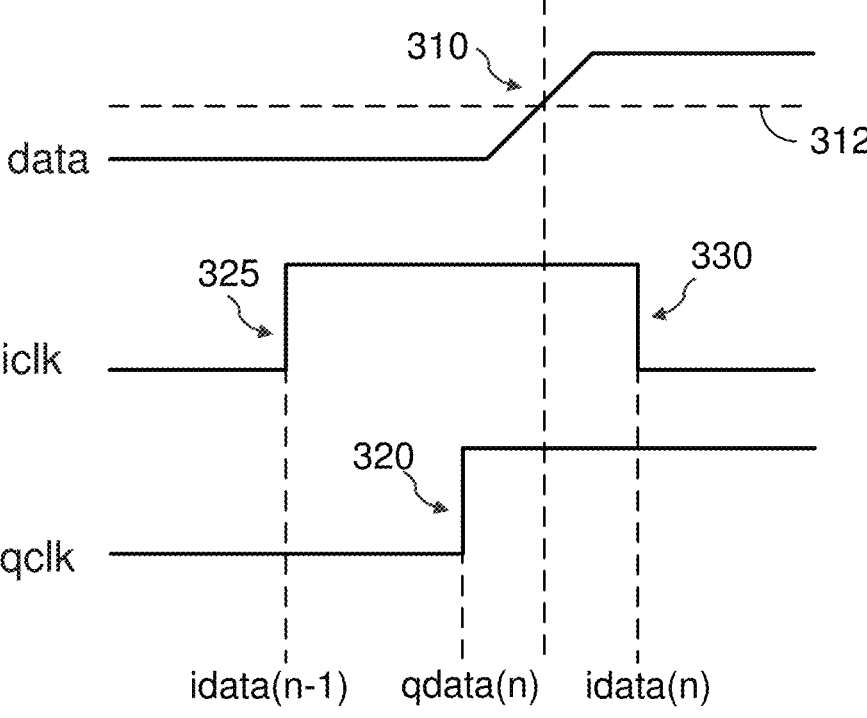
FIG. 3B is a timing diagram illustrating another example of the serial data signal, the first clock signal, and the second clock signal according to certain aspects of the present disclosure.
Figure 3C:
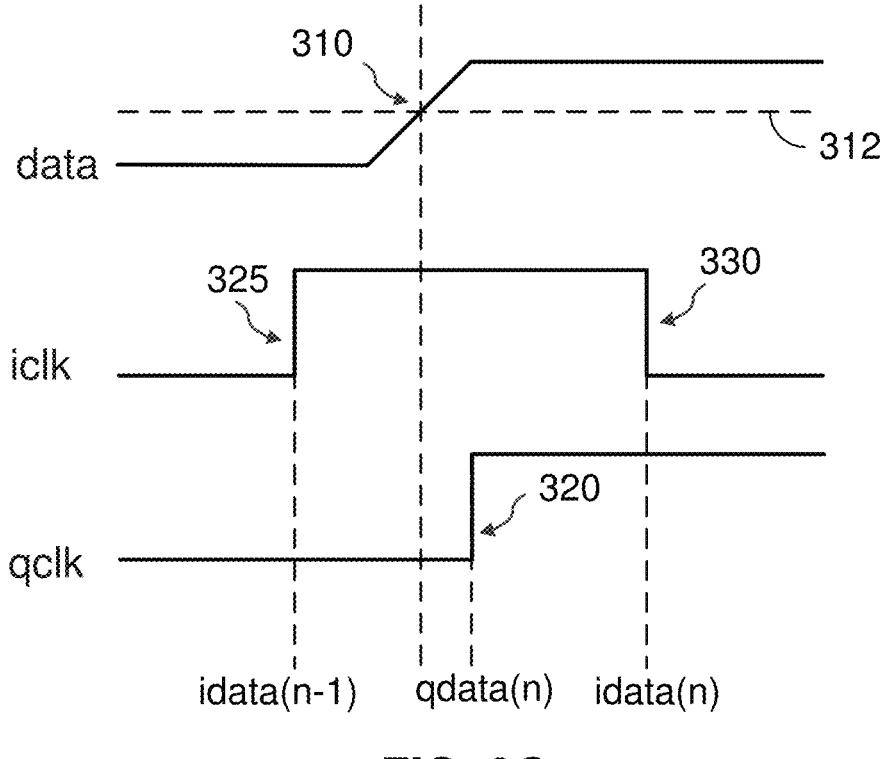
FIG. 3C is a timing diagram illustrating yet another example of the serial data signal, the first clock signal, and the second clock signal according to certain aspects of the present disclosure.

FIG. 3A shows an example where the sample qdata(n) is aligned with a data transition 310 in the serial data signal. FIG. 3B shows an example where the sample qdata(n) is located to the left of the data transition 310, and FIG. 3C shows an example where the sample qdata(n) is located to the right of the data transition. In this example, the phase adjuster 230 may be configured to determine whether the sample qdata(n) is to the left of the data transition 310 (i.e., early) or to the right of the data transition 310 (i.e., late) by comparing the bit values of the samples idata(n−1), qdata(n), and idata(n). For example, the phase adjuster 230 may determine the sample qdata(n) is to the left of the data transition 310 (shown in FIG. 3B) when the bit values of the samples idata(n−1) and qdata(n) are the same and different from the bit value of the sample idata(n). The phase adjuster 230 may determine the sample qdata(n) is to the right of the data transition (shown in FIG. 3C) when the bit values of the samples qdata(n) and idata(n) are the same and different from the bit value of the sample idata(n−1). However, it is to be appreciated that the present disclosure is not limited to this example.

The phase adjuster 230 may then make an up/down decision for the first clock signal iclk based on whether the sample qdata(n) is to the left or right of the data transition 310 (i.e., early or late), in which an up decision corresponds to a phase increase and a down decision corresponds to a phase decrease. For example, if the sample qdata(n) is to the left of the data transition 310 (shown in FIG. 3B), then the phase adjuster 230 may make an up decision for the phase of the first clock signal iclk. If the sample qdata(n) is to the right of the data transition 310 (shown in FIG. 3C), then the phase adjuster 230 may make a down decision for the phase of the first clock signal iclk.

The phase adjuster 230 may then output the phase adjustment signal to the phase control circuit 220 indicating the direction of the phase adjustment based on the up/down decision. For example, the phase adjustment signal may indicate a stepwise increase of the phase (i.e., +Δ) for an up decision and a stepwise decrease of the phase (i.e., −Δ) for a down decision. The phase adjustment signal may also indicate no change (i.e., 0), for example, when the serial data signal includes multiple consecutive bits having the same bit value. In this case, there may not be a data transition during the consecutive bits for the phase adjuster 230 to determine a phase adjustment.

The phase control circuit 220 receives the phase adjustment signal and updates the phase control signal (e.g., the phase control code pi_ctrl_code) based on the phase adjustment signal. For example, the phase control circuit 220 may adjust the phase control signal by +Δ when the phase adjustment signal indicates a stepwise phase increase (i.e., positive direction) and adjust the phase control signal by-A when the phase adjustment signal indicates a stepwise phase decrease (i.e., negative direction). The step size 4 may be set, for example, based on a desired gain for the CDR circuit 160, as discussed further below.

Figure 4:
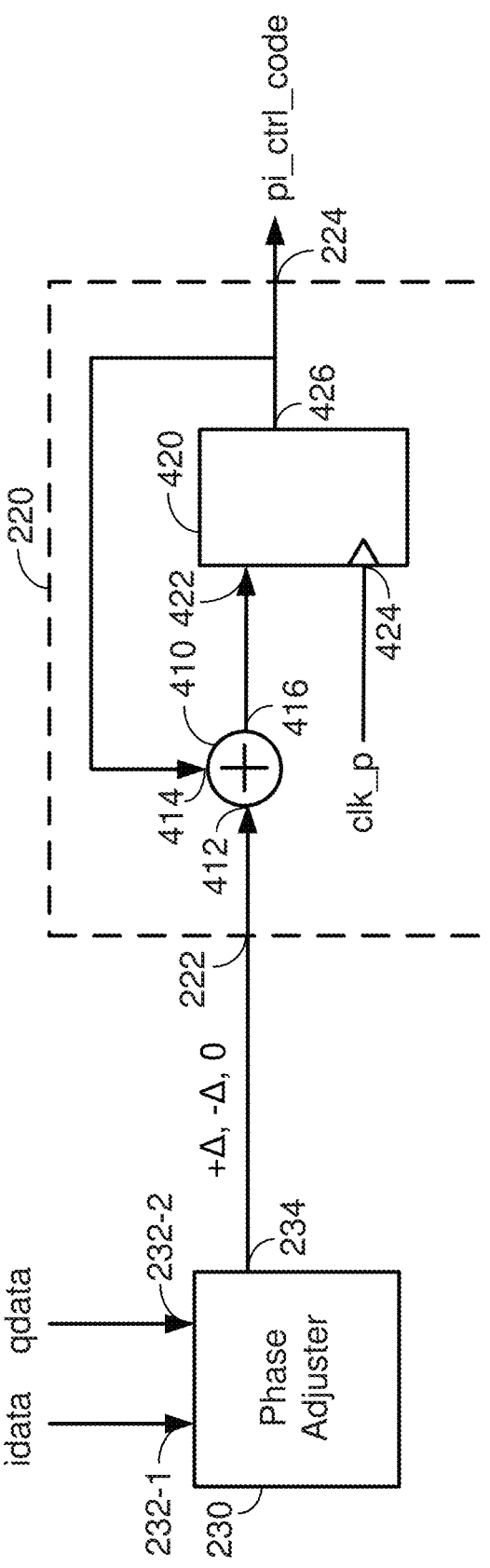
FIG. 4 shows an exemplary implementation of a phase control circuit according to certain aspects of the present disclosure.

FIG. 4 shows an exemplary implementation of the phase control circuit 220 according to certain aspects. In this example, the phase control circuit 220 outputs the phase control code pi_ctrl_code to the clock circuit 210 to set the phase of the first clock signal iclk.

In the example in FIG. 4, the phase control circuit 220 includes an adder 410 and a flip-flop 420. The flip-flop 420 has a code input 422, a clock input 424, and an output 426 coupled to the output 224 of the phase control circuit 220. The adder 410 has a first input 412 coupled to the input 222 of the phase control circuit 220, a second input 414 coupled to the output 426 of the flip-flop 420, and an output 416 coupled to the code input 422 of the flip-flop 420.

During operation, the first input 412 of the adder 410 is configured to receive the phase adjustment signal from the phase adjuster 230, and the second input 414 of the adder 410 is configured to receive the phase control code pi_ctrl_code. As discussed above, the phase adjustment signal may indicate a phase adjustment of +Δ, a phase adjustment of −Δ, or no change (i.e., 0) where Δ is the step size. The adder 410 adds the phase adjustment to the phase control code pi_ctrl_code to generate an updated pi_ctrl_code at the output 416 of the adder 410.

The flip-flop 420 is configured to receive the updated phase control code pi_ctrl_code at the code input 442 and receive a clock signal clk_p at the clock input 424. The flip-flop 420 is configured to latch the updated phase control code pi_ctrl_code on an edge (e.g., rising edge) of the clock signal clk_p and output the latched updated phase control code pi_ctrl_code at the output 426. In this example, the phase control circuit 220 may update the phase control code pi_ctrl_code based on the phase adjustment signal from the phase adjuster 230 for each period (i.e., cycle) of the clock signal clk_p. However, it is to be appreciated that the phase control code pi_ctrl_code needs not be updated for every period of the clock signal clk_p.

In this example, the phase adjuster 230 and the phase control circuit 220 operate in the digital domain. The response time of the phase adjuster 230 and the phase control circuit 220 is limited by the frequency of the clock signal clk_p (which may be much lower than the frequency of the serial data signal) and timing closure constraints, leading to a reduced CDR bandwidth. To compensate for the reduced CDR bandwidth, the gain of the CDR circuit 160 may be increased by increasing the step size A of the phase adjustment signal, which allows the phase control code pi_ctrl_code to jump by larger steps to track changes in the serial data signal.

However, a large increase in the step size may cause the CDR circuit 160 to overcorrect the phase and degrade jitter performance. Therefore, there is a tradeoff between CDR bandwidth and jitter performance.

Figure 5:
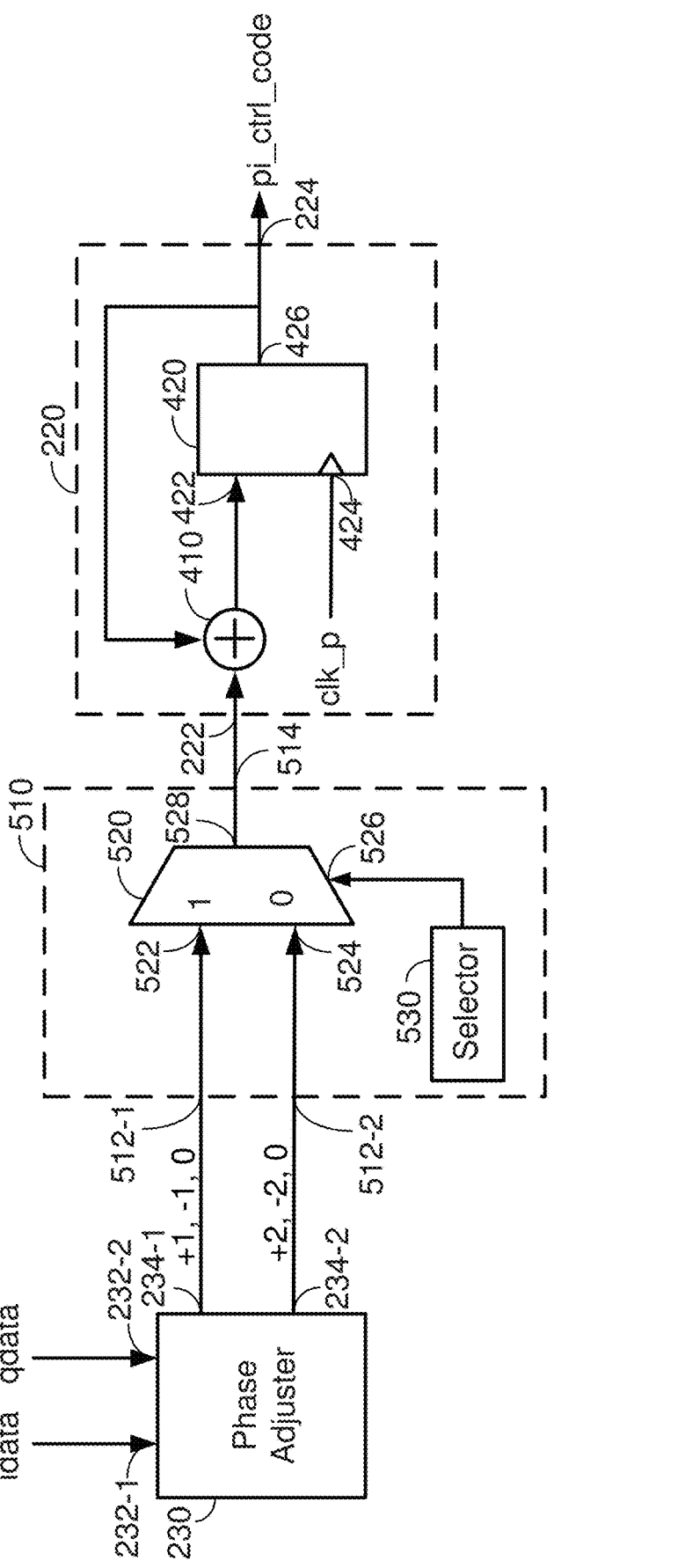
FIG. 5 shows an example of a step-size selection circuit according to certain aspects of the present disclosure.

In certain aspects, a good balance between CDR bandwidth and jitter performance may be achieved using an average non-integer step size. In this regard, FIG. 5 shows an example in which the CDR circuit 160 includes a step-size selection circuit 510 for achieving an average non-integer step size according to certain aspects. As used herein, a non-integer step size is a step size that includes a fractional part.

In this example, the phase adjuster 230 is configured to generate a first adjustment signal having a first step size and a second adjustment signal having a second step size (e.g., based on the up/down decisions discussed above). The phase adjustments in the first and second adjustment signals are in the same direction but with different step sizes (i.e., the first step size and the second step size). In this example, the output 234 of the phase adjuster 230 includes a first output 234-1 for outputting the first phase adjustment signal and a second output 234-2 for outputting the second phase adjustment signal.

In the example in FIG. 5, the step-size selection circuit 510 has a first input 512-1, a second input 512-2, and an output 514. The first input 512-1 is coupled to the first output 234-1 of the phase adjuster 230 for receiving the first phase adjustment signal, and the second input 512-2 is coupled to the second output 234-2 of the phase adjuster 230 for receiving the second phase adjustment signal. The output 514 is coupled to the input 222 of the phase control circuit 220. In this example, the step-size selection circuit 510 achieves a desired average non-integer step size between the first step size and the second step size by switching the phase control circuit 220 between the first phase adjustment signal and the second phase adjustment such that the average step size is approximately equal to the desired average non-integer step size, as discussed further below.

In the example in FIG. 5, the step-size selection circuit 510 includes a multiplexer 520 and a selector 530. The multiplexer 520 has a first input 522, a second input 524, a select input 526, and an output 528. The first input 522 is coupled to the first output 234-1 of the phase adjuster 230 for receiving the first phase adjustment signal, the second input 524 is coupled to the second output 234-2 of the phase adjuster 230 for receiving the second phase adjustment signal, and the output 528 is coupled to the input 222 of the phase control circuit 220. The select input 526 is configured to receive a select signal from the selector 530. The multiplexer 520 is configured to select the first phase adjustment signal or the second phase adjustment signal based on the select signal, and output the selected one of the first and second phase adjustment signals at the output 528. For example, the multiplexer 520 may select the first phase adjustment signal when the select signal is one and select the second phase adjustment signal when the select signal is zero, or vice versa.

The selector 530 is configured to generate the select signal for the multiplexer 520 and output the select signal to the select input 526 of the multiplexer 520. In certain aspects, the selector 530 is configured to cause the multiplexer 520 to switch between the first phase adjustment signal and the second phase adjustment using the select signal such that the average step size is equal to a desired average non-integer step size. By way of example, in the example shown in FIG. 5, the step size of the first phase adjustment signal (i.e., the first step size) is one and the step size of the second phase adjustment signal (i.e., the second step size) is two. In this example, the selector 530 may achieve an average non-integer step size of 1.5 by causing the multiplexer 520 to select the first adjustment signal half of the time and select the second adjustment signal half of the time. In another example, the selector 530 may achieve an average non-integer step size of 1.75 by causing the multiplexer 520 to select the second adjustment signal 75 percent of the time and select the first adjustment signal 25 percent of the time. It is to be appreciated that the first step size is not limited to the example of one and the second step size is not limited to the example of two.

The selector 530 may be implemented with a counter and a digital signal processor (DSP). However, the selector 530 does not take into account non-linearities in the clock circuit 210 when selecting between the first step size and the second step size to achieve the desired average non-integer step size, which limits jitter performance, as discussed further below.

Figure 6:
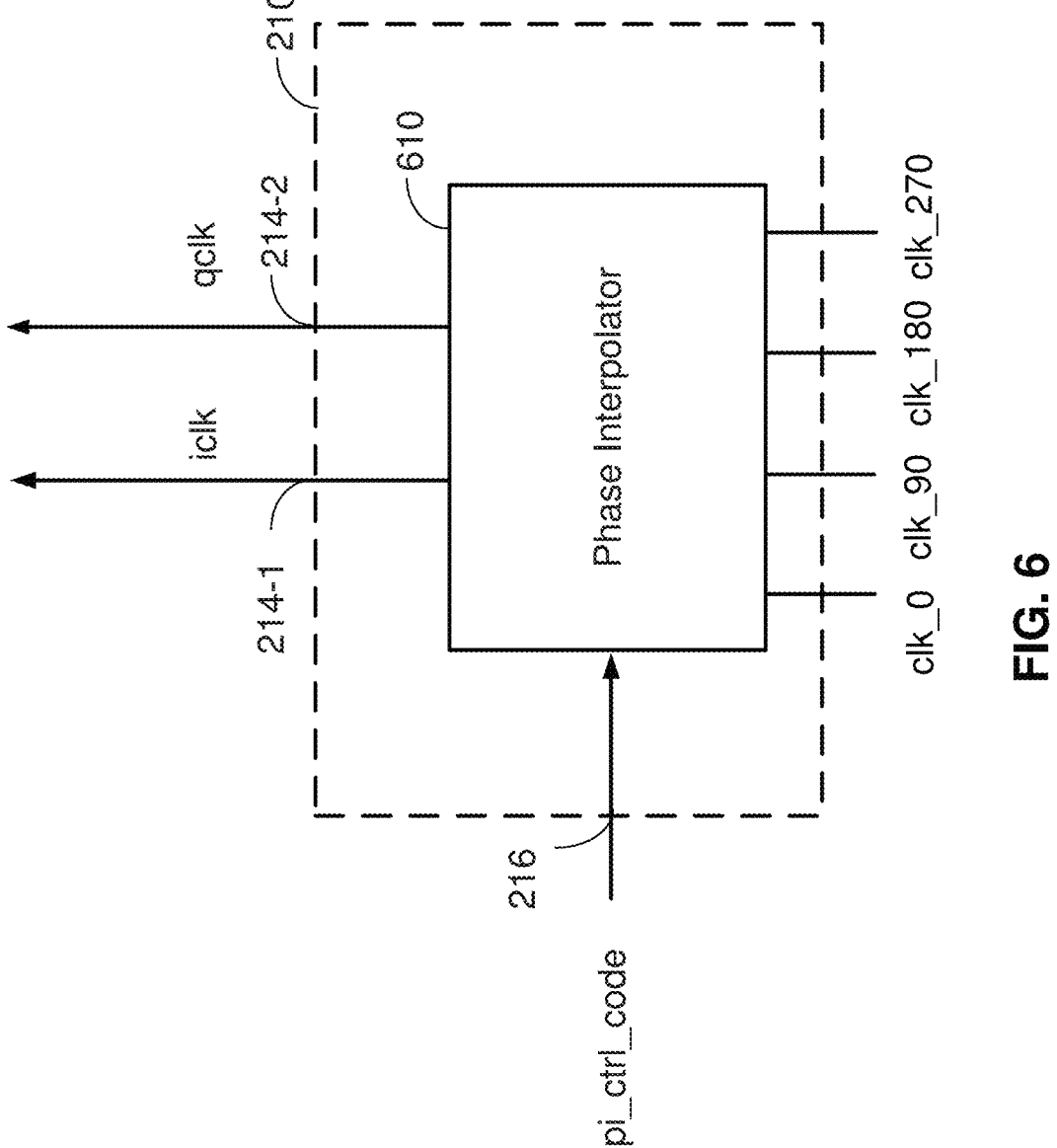
FIG. 6 shows an example of a phase interpolator according to certain aspects of the present disclosure.

FIG. 6 shows an exemplary implementation of the clock circuit 210 according to certain aspects. In this example, the clock circuit 210 includes a phase interpolator 610 configured to adjust the phase of the first clock signal iclk. The phase interpolator 610 is configured to receive multiple clock signals that are evenly spaced apart in phase. The multiple clock signals may also be referred to as multiple clock phases. In the example shown in FIG. 6, the multiple clock signals include four clock signals (i.e., four clock phases) that are spaced apart by 90 degrees including clock signal clk_0, clock signal clk_90, clock signal_180, and clock signal clk_270. However, it is to be appreciated that the phase interpolator 610 is not limited to this example. The phase interpolator 610 is configured to select a pair of the clock signals at a time and mix the clock signals in the selected pair of clock signals to provide a phase between the phases of the clock signals.

Figure 7:
FIG. 7 shows an exemplary implementation of the phase interpolator according to certain aspects of the present disclosure.

FIG. 7 shows an exemplary implementation of the phase interpolator 610 according to certain aspects. In this example, the clock circuit 210 includes a multiplexer 710, a clock mixer 720, and a control circuit 730. The multiplexer 710 has a first input 712-1, a second input 712-2, a third input 712-3, a fourth input 712-4, a select input 716, a first output 714-1, and a second output 714-2. The first input 712-1 receives the clock signal clk_0, the second input 712-2 receives the clock signal clk_90, the third input 712-3 receives the clock signal clk_180, and the fourth input 712-4 receives the clock signal clk_270. The multiplexer 710 is configured to select two of the clock signals clk_0, clk_90, clk_180, and clk_270 at a time based on a clock select signal received at the select input 716, output one of the selected clock signals at the first output 714-1, and output the other one of the selected clock signals at the second output 714-2. In the discussion below, exemplary phases are given with respect to a reference phase (e.g., the phase of the clock signal clk_0).

The mixer 720 has a first input 722-1 coupled to the first output 714-1 of the multiplexer 710, a second input 722-2 coupled to the second output 714-2 of the multiplexer 710, a weight control input 726, and an output 724. The mixer 720 receives the two selected clock signals (i.e., the selected pair of clock signals) from the multiplexer 710 via the first input 722-1 and the second input 722-2. The mixer 720 is configured to mix the two selected clock signals to generate the first clock signal iclk in which the phase of the first clock signal iclk is between the phases of the two selected clock signals. The first clock signal iclk may be output to the data sampler 150 via the output 724. During the mixing of the two selected clock signals, the mixer 720 applies a first weight (e.g., a first drive strength) to a first one of the selected clock signals and applies a second weight (e.g., a second driver strength) to a second one of the selected clock signals. The first weight and the second weight are controlled by a weight control signal received at the weight control input 726.

In this example, the control circuit 730 has an input 732 coupled to the output 224 of the phase control circuit 220 (not shown in FIG. 7), a first output 734 coupled to the select input 716 of the multiplexer 710, and a second output 736 coupled to the weight control input 726 of the mixer 720. The control circuit 730 is configured to receive the phase control code pi_ctrl_code at the input 732 and set the phase of the first clock signal iclk based on the received phase control code pi_ctrl_code. The control circuit 730 sets the phase of the first clock signal iclk by controlling the two clock signals (i.e., the pair of clock signals) that are selected by the multiplexer 710 using the clock select signal and controlling the first and second weights of the mixer 720 using the weight control signal.

In this example, the clock selection by the multiplexer 710 allows the phase of the first clock signal iclk to be rotated 360 degrees. For example, to set the phase of the first clock signal iclk to a phase within the range of 0 to 90 degrees, the control circuit 730 causes the multiplexer 710 to select the clock signals clk_0 and clk_90. To set the phase of the first clock signal iclk to a phase within the range of 90 to 180 degrees, the control circuit 730 causes the multiplexer 710 to select the clock signals clk_90 and clk_180. To set the phase of the first clock signal iclk to a phase within the range of 180 to 270 degrees, the control circuit 730 causes the multiplexer 710 to select the clock signals clk_180 and clk_270. To set the phase of the first clock signal iclk to a phase within the range of 270 to 0 degrees, the control circuit 730 causes the multiplexer 710 to select the clock signals clk_270 and clk_0 (note that a 360 rotation rotates back to 0 degrees).

The control circuit 730 may then set the phase of the first clock signal iclk to a phase within the phase range corresponding to the selected pair of clock signals by controlling the first and second weights of the mixer 720 using the weight control signal. For example, to set the phase of the first clock signal iclk to a phase of 45 degrees based on the phase control code pi_ctrl_code, the control circuit 730 causes the multiplexer 710 to select the pair of clock signals clk_0 and clk_90 and sets the first weight and the second weight equal to each other. In this example, to set the phase between 0 to 45 degrees, the control circuit 730 sets the first weight greater than the second weight. To set the phase between 45 and 90 degrees, the control circuit 730 sets the second weight greater than the first weight. In this example, the mixer 720 employs phase interpolation to adjust the phase of the first clock signal iclk within the phase range corresponding to the selected pair of clock signals (i.e., selected pair of clock phases).

The clock circuit 210 may generate the second clock signal qclk by shifting the phase of the first clock signal ickl by 90 degrees. In some implementations, the clock circuit 210 may include a second instance of the multiplexer 710 and the mixer 720 to generate the second clock signal qclk. In these implementations, the control circuit 730 selects a pair of clock signals for the second clock signal qclk that is adjacent to the pair of clock signals selected for the first clock signal iclk such that the phase of the second clock signal qclk is spaced apart from the phase of the first clock signal iclk by 90 degrees. The same weights may be used for both mixers.

It is to be appreciated that the phase interpolator 610 is not limited to the exemplary implementation shown in FIG. 7.

A challenge with using a phase interpolator is that the phase interpolator needs to switch clock signals to enable phase adjustment (i.e., phase rotation) across 360 degrees. For example, when the phase crosses 90 degrees in the positive direction, the phase interpolator 610 needs to switch the selected pair of clock signals from clk_0 and clk_90 to clk_90 and clk 180. The clock switching causes abrupt transitions in the first clock signal iclk which increases non-linearity in the first clock signal ickl (which is an analog signal). In the examples in FIGS. 6 and 7, the phase interpolator 610 has four clock-switching boundaries where the phase interpolator 610 switches the selected pair of clock signals including 0 degrees, 90 degrees, 180 degrees, and 270 degrees. In this example, the phase interpolator 610 experiences non-linearity due to clock switching at each of the clock-switching boundaries. However, the step-size selection circuit 510 does not take into account non-linearities in the phase interpolator 610 at the clock-switching boundaries, which degrades the jitter tolerance of the data sampler 150 and the CDR circuit 160.

The phase interpolator 610 may also experience non-linearities when the phase crosses a weight-transition boundary where the first weight transitions from being greater than the second weight to less than the second weight in the positive direction and where the second weight transitions from being greater than the first weight to being less than the first weight in the negative direction. The non-linearities may be due to mismatches between devices (e.g., transitions) in the mixer 720. In the examples in FIGS. 6 and 7, the phase interpolator 610 has weight-transition boundaries at 45 degrees, 135 degrees, 225 degrees, and 315 degrees (i.e., phases at which the first weight and the second weight are approximately equal). Thus, in this example, the phase interpolator 610 may experience non-linearity at each of the weight-transition boundaries. However, the step-size selection circuit 510 does not take into account non-linearities in the phase interpolator 610 at the weight-transition boundaries, which degrades the jitter tolerance of the data sampler 150 and the CDR circuit 160.

To address the above, aspects of the present disclosure provide a step-size selection circuit that takes into account non-linearities in the phase interpolator 610 at the clock-switching boundaries and the weight-transition boundaries. In certain aspects, the step-size selection circuit compares the phase control signal (e.g., the phase control code pi_ctrl_code) with first phase zones and second phase zones. Each of the first phase zones includes one of the clock-switching boundaries (e.g., 0 degrees, 90 degrees, 180 degrees, and 270 degrees) or one of the weight-transition boundaries (e.g., 45 degrees, 135 degrees, 225 degrees, and 315 degrees). The second phase zones are outside of the first phase zones. When the phase control signal is within one of the first phase zones, the step-size selection circuit selects the smaller step size (e.g., the first step size). This reduces the gain of the CDR circuit which reduces the impact of non-linearities when the phase control signal crosses one of the clock-switching boundaries or one of the weight-transition boundaries. When the phase control signal is within one of the second phase zones (i.e., outside of the first phase zones), the step-size selection circuit selects the larger step size (e.g., the second step size) to increase the CDR bandwidth. The above features and other features of the present disclosure are discussed further below.

Figure 8:
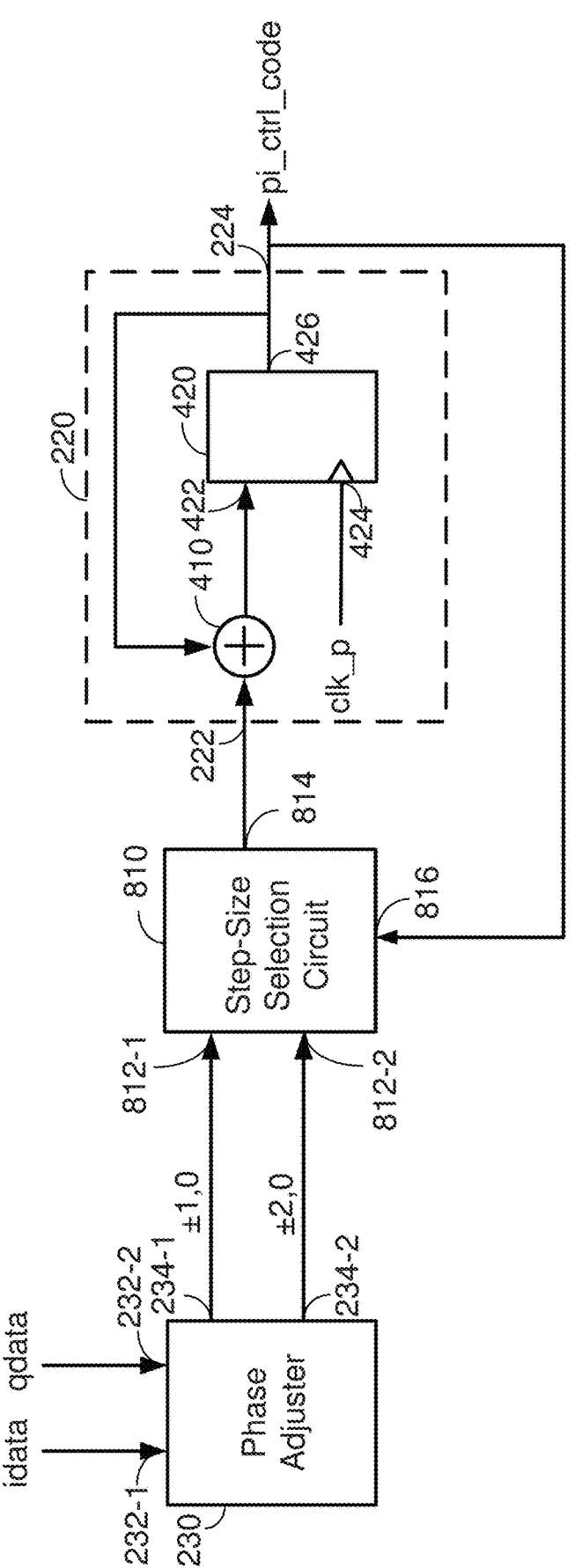
FIG. 8 shows an example of a step-size selection circuit for improving CDR linearity according to certain aspects of the present disclosure.

FIG. 8 shows an example of a step-size selection circuit 810 according to certain aspects. As discussed further below, the step-size selection circuit 810 takes into account non-linearities in the phase interpolator 610, which improves jitter tolerance. In this example, the step-size selection circuit 810 has a first input 812-1 coupled to the first output 234-1 of the phase adjuster 230 for receiving the first phase adjustment signal, a second input 812-2 coupled to the second output 234-2 of the phase adjuster 230 for receiving the second phase adjustment signal, a third input 816 coupled to the output 224 of the phase control circuit 220 for receiving the phase control code pi_ctrl_code, and an output 814 coupled to the input 222 of the phase control circuit 220.

The step-size selection circuit 810 is configured to determine whether the phase control code pi_ctrl_code is within one of first phase zones or within one of second phase zones. If the phase control code pi_ctrl_code is located within one of the first phase zones, then the step-size selection circuit 810 outputs the first adjustment signal (i.e., the first step size) to the phase control circuit 220. If the phase control code pi_ctrl_code is located within one of the second phase zones (i.e., outside of the first phase zones), then the step-size selection circuit 810 outputs the second adjustment signal (i.e., the second step size) to the phase control circuit 220.

Figure 9:
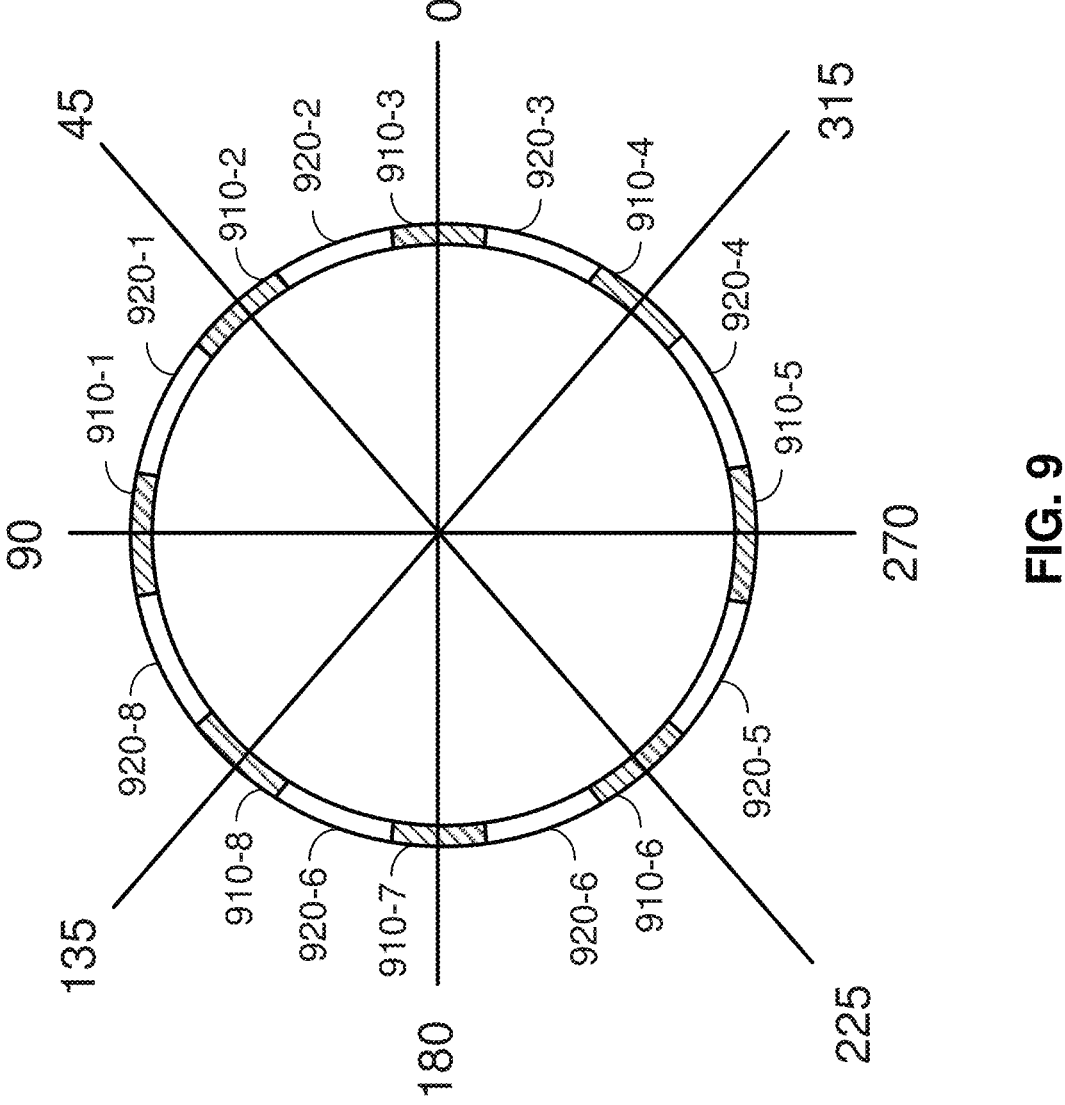
FIG. 9 is a diagram illustrating an example of phase zones according to certain aspects of the present disclosure.

FIG. 9 shows an example of the first phase zones 910-1 to 910-8 and the second phase zones 920-1 to 920-8 according to certain aspects. In FIG. 9, the first phase zones 910-1 to 910-8 are shaded to distinguish the first phase zones 910-1 to 910-8 from the second phase zones 920-1 to 920-8. The term "phase zone" may also be referred to as a phase range, a phase region, or another term. For the example of the phase control code pi_ctrl_code, a phase zone may be defined by a set of codes located within the phase zone.

In certain aspects, the first phase zones 910-1 to 910-8 are stored in a memory in the step-size selection circuit 810. For example, the first phase zones 910-1 to 910-8 may be stored in the memory by storing a set of codes for the phase control code pi_ctrl_code that are located within the phase zones 910-1 to 910-8. In this example, the step-size selection circuit 810 determines whether the current phase control code pi_ctrl_code is located within one of the first phase zones 910-1 to 910-8 by determining whether the current control code pi_ctrl_code matches one of the codes located in the first phase zones 910-1 to 910-8. If the control code pi_ctrl_code matches one of the codes in the first phase zones 910-1 to 910-8, then the step-size selection circuit 810 outputs the first adjustment signal (i.e., the first step size) to the phase control circuit 220. If the phase control code pi_ctrl_code does not match any of the codes in the first phase zones 910-1 to 910-8 (i.e., the phase control code pi_ctrl_code is outside of the first phase zones 910-1 to 910-8), then the step-size selection circuit 810 outputs the second adjustment signal (i.e., the second step size) to the phase control circuit 220. In this case, the phase control code pi_ctrl_code is within one of the second phase zones 920-1 to 920-8. In this example, the first phase zones 910-1 to 910-8 may be programmed into the step-size selection circuit 810 by programming the set of codes for the first phase zones 910-1 to 910-8 into the memory of the step-size selection circuit 810.

As discussed above, the first step size (e.g., one) is smaller than the second step size (e.g., two). Thus, in this example, the step-size selection circuit 810 outputs the smaller step size (i.e., the first step size) to the phase control circuit 220 when the phase control circuit pi_ctrl_code is within one of the first phase zones 910-1 to 910-8 and outputs the larger step size (i.e., the second step size) to the phase control circuit 220 when the phase control circuit pi_ctrl_code is within one of the second phase zones 920-1 to 920-8 (i.e., outside of the first phase zones 910-1 to 910-8).

In the example shown in FIG. 9, each of the first phase zones 910-1, 910-3, 910-5, and 910-7 includes one of the clock-switching boundaries (e.g., 0 degrees, 90 degrees, 180 degrees, and 270 degrees). Each of the first phase zones 910-2, 910-4, 910-6, and 910-8 includes one of the weight-transition boundaries (e.g., 45 degrees, 135 degrees, 225 degrees, and 315 degrees). Each of the second phase zones 920-1 to 920-8 is between two of the first phase zones 910-1 to 910-8.

In this example, the step-size selection circuit 810 outputs the first adjustment signal (i.e., the first step size) to the phase control circuit 220 if the phase control circuit pi_ctrl_code is within one of the first phase zones 910-1, 910-3, 910-5, and 910-7. Since the first step size is smaller than the second step size, this causes the gain of the CDR circuit 160 to be smaller when the phase crosses one of the clock-switching boundaries (e.g., 0 degrees, 90 degrees, 180 degrees, and 270 degrees), and therefore reduces the impact of non-linearities due to clock-switching.

In this example, the step-size selection circuit 810 also outputs the first adjustment signal (i.e., the first step size) to the phase control circuit 220 if the phase control circuit pi_ctrl_code is within one of the first phase zones 910-2, 910-4, 910-6, and 910-8. Since the first step size is smaller than the second step size, this causes the gain of the CDR circuit 160 to be smaller when the phase crosses one of the weight-transition boundaries (e.g., 45 degrees, degrees, 180 degrees, and 270 degrees), and therefore reduces the impact of non-linearities due to the weight transitions discussed above. As discussed above, non-linearities at the weight transitions may be due to mismatches between devices (e.g., transitions) in the mixer 720. Thus, in this example, the compare circuit 1020 reduces the impact of non-linearities due to device mismatches in the mixer 720. This relaxes matching constraints on the mixer 720, which reduces design iteration, area, and power consumption.

In this example, the sizes of the first phase zones 910-1 to 910-8 may be chosen to achieve a desired average non-integer step size. For example, for the example where the first step size is one and the second step size is two, an average non-integer step size of 1.5 may be achieved by choosing the sizes of the first phase zones 910-1 to 910-8 such that approximately half of the possible codes for the phase control code pi_ctrl_code are located within the first phase zones 910-1 to 910-8 and approximately half of the possible codes for the phase control code pi_ctrl_code are located within the second phase zones 920-1 to 920-8. In this case, the step-size selection circuit 810 selects the first step size of one approximately half of the time and selects the second step size of two approximately half of the time for an average step size of 1.5. In another example, an average non-integer step size of 1.75 may be achieved by choosing the sizes of the first phase zones 910-1 to 910-8 such that approximately a quarter of the possible codes for the phase control code pi_ctrl_code are located within the first phase zones 910-1 to 910-8. In this case, the step-size selection circuit 810 selects the first step size of one approximately 25 percent of the time and selects the second step size of two approximately 75 percent of the time for an average step size of 1.75. In both examples, the clocks-switching boundaries and the weight-transition boundaries are located within the first phase zones 910-1 to 910-8. Thus, a desired average non-integer step size may be achieved by sizing the first phase zones 910-1 to 910-8 accordingly.

It is to be appreciated that the step-size selection circuit 810 is not limited to the examples given above. For example, in some implementations, the phase zones 910-2, 910-4, 910-6, and 910-8 for the weight transitions may be omitted (e.g., for cases where there is good device matching in the mixer 720).

Figure 10:
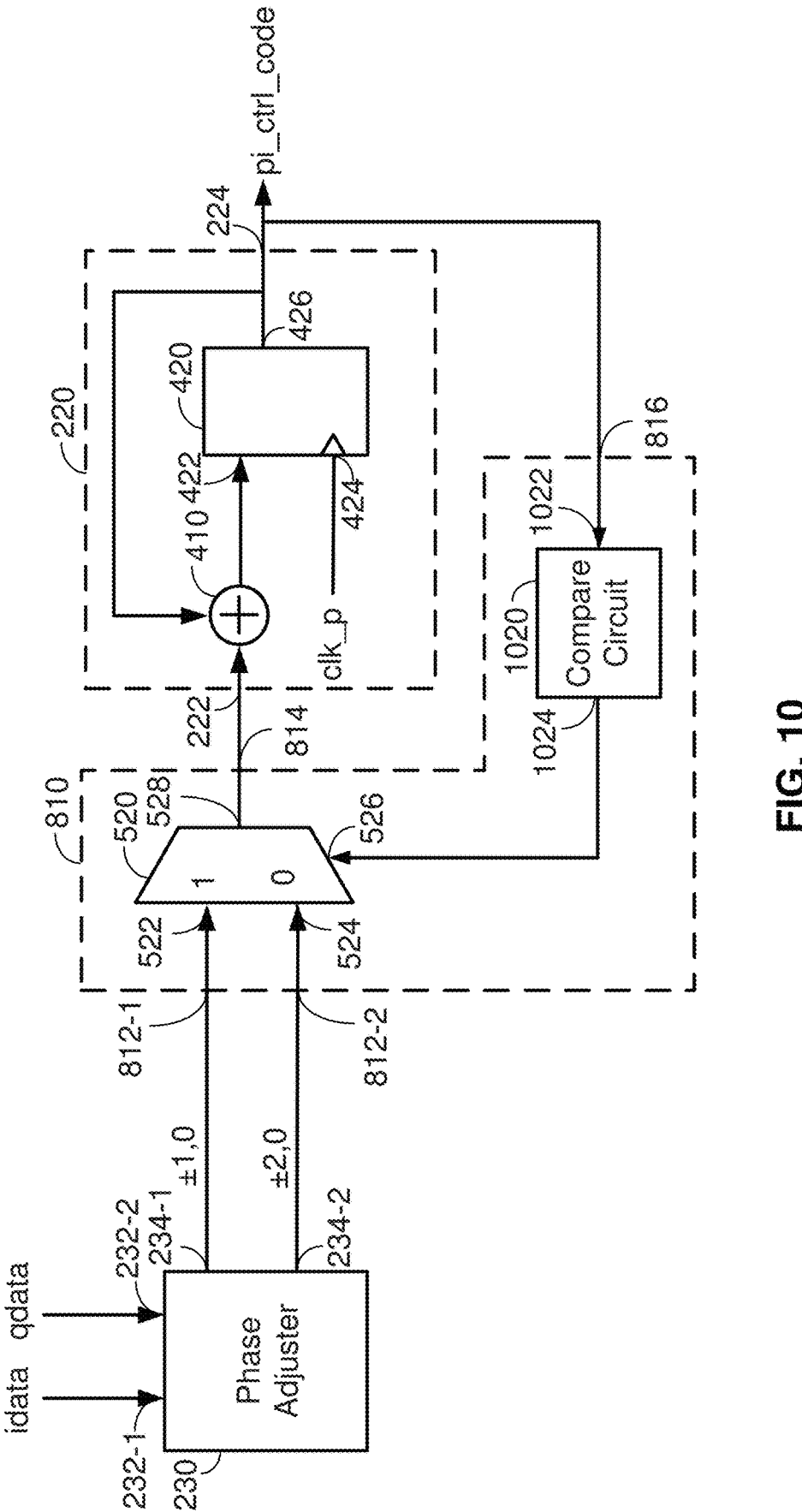
FIG. 10 shows an exemplary implementation of the step-size selection circuit according to certain aspects of the present disclosure.

FIG. 10 shows an exemplary implementation of the step-size selection circuit 810 according to certain aspects. In this example, the step-size selection circuit 810 includes the multiplexer 520 discussed above and a compare circuit 1020. The first input 522 of the multiplexer 520 is coupled to the first output 234-1 of the phase adjuster 230, the second input 524 of the multiplexer 520 is coupled to the second output 234-2 of the phase adjuster 230, and the output 528 of the multiplexer 520 is coupled to the input 222 of the phase control circuit 220. As discussed further below, the multiplexer 520 is configured to select the first phase adjustment signal (i.e., the first step size) or the second phase adjustment signal (i.e., the second step size) from the phase adjuster 230 under the control of the compare circuit 1020, and output the selected one of the first and second phase adjustment signals to the phase control circuit 220.

The compare circuit 1020 has an input 1022 and an output 1024. The input 1022 is coupled to the output 224 of the phase control circuit 220 to receive the phase control code pi_ctrl_code, and the output 1024 is coupled to the select input 526 of the multiplexer 520. The compare circuit 1020 is configured to compare the phase control code pi_ctrl_code with the first phase zones 910-1 to 910-8 and determine whether the phase control code pi_ctrl_code is located within one of the first phase zones 910-1 to 910-8 based on the comparison. If the phase control code pi_ctrl_code is located within one of the first phase zones 910-1 to 910-8, then the compare circuit 1020 causes the multiplexer 520 to select the first adjustment signal (i.e., the first step size) using the select signal. If the phase control code pi_ctrl_code is located within one of the second phase zones 920-1 to 920-8 (i.e., outside of the first phase zones 910-1 to 910-8), then the compare circuit 1020 causes the multiplexer 520 to select the second adjustment signal (i.e., the second step size) using the select signal. For example, the compare circuit 1020 may cause the multiplexer 520 to select the second adjustment signal if the phase control code pi_ctrl_code is not within the first phase zones 910-1 to 910-8 based on the comparison.

For example, the compare circuit 1020 may compare the current phase control code pi_ctrl_code with codes located within the first phase zones 910-1 to 910-8. The codes within the first phase zones 910-1 to 910-8 may be stored in a memory in the compare circuit 1020. The compare circuit 1020 may determine whether the phase control code pi_ctrl_code is within one of the first phase zones 910-1 to 910-8 by determining whether the control code pi_ctrl_code matches one of the codes located in the first phase zones 910-1 to 910-8. If the control code pi_ctrl_code matches one of the codes, then the compare circuit 1020 causes the multiplexer 520 to select the first adjustment signal (i.e., the first step size) for output to the phase control circuit 220. If the phase control code pi_ctrl_code does not match any of the codes (i.e., the phase control code pi_ctrl_code is outside of the first phase zones 910-1 to 910-8), then the compare circuit 1020 causes the multiplexer 520 to select the second adjustment signal (i.e., the second step size) for output to the phase control circuit 220. In this case, the phase control code pi_ctrl_code is within one of the second phase zones 920-1 to 920-8. In this example, the first phase zones 910-1 to 910-8 may be programmed into the compare circuit 1020 by programming the set of codes located in the first phase zones 910-1 to 910-8 into the memory of the compare circuit 1020.

The compare circuit 820 may include one or more comparators, gated logic, a field programmable gate array (FPGA), programmable logic devices (PLDs), discrete hardware circuits, a processor and/or any combination thereof configured to perform the operations discussed above according to various aspects.

Figure 11:
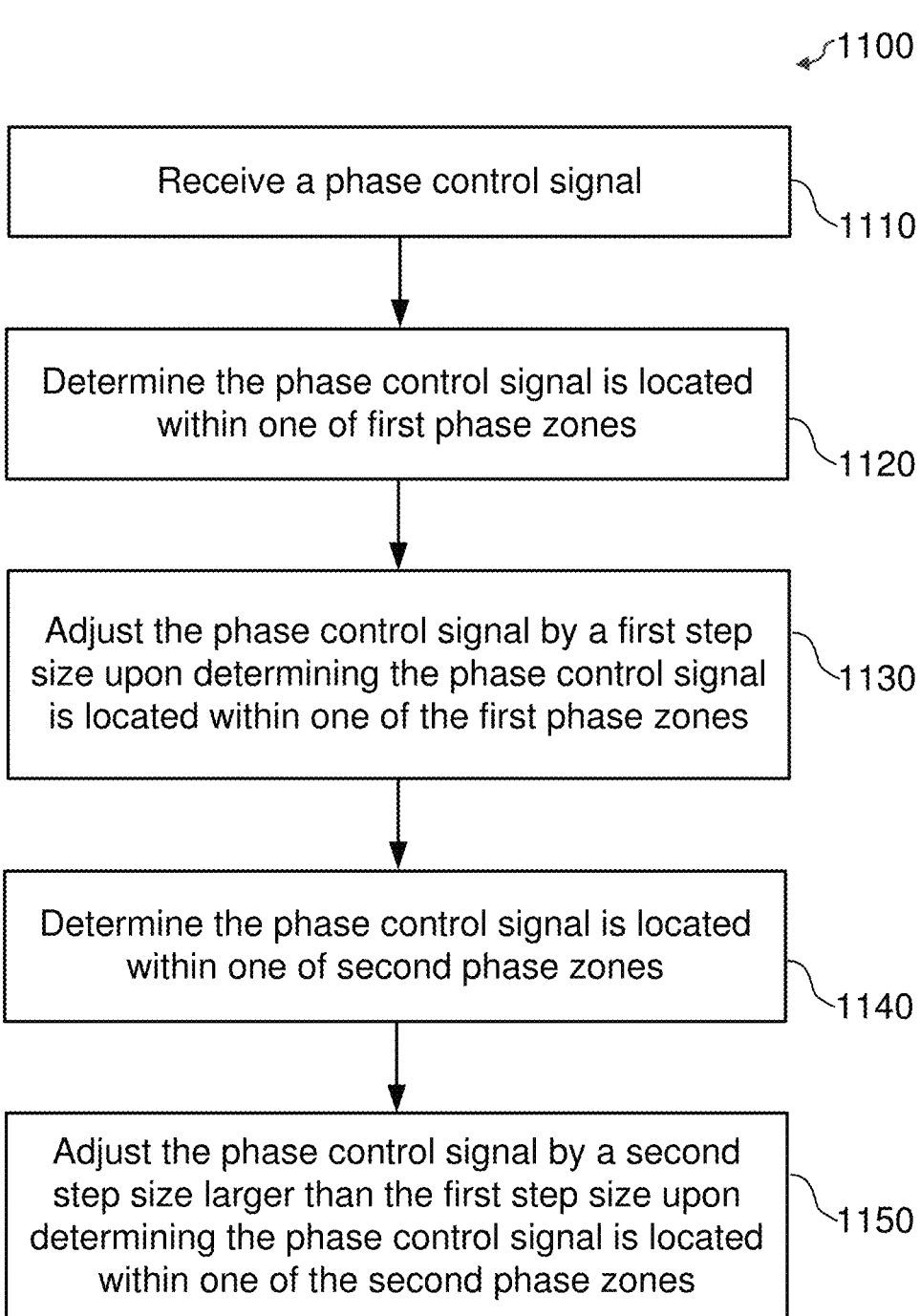
FIG. 11 is a flowchart illustrating a method for adjusting a phase according to certain aspects of the present disclosure.

FIG. 11 illustrates a method 1100 for adjusting a phase of a clock signal according to certain aspects. The clock signal may correspond to the clock signal iclk used by the data sampler 150 for sampling the serial data signal.

At clock 1110, a phase control signal for a phase interpolator is received. For example, the phase control signal may correspond to the phase control code pi_ctrl_code.

At block 1120, a determination is made that the phase control signal is located within one of first phase zones. For example, the determination may be made by the compare circuit 1020. The first phase zones may correspond to the first phase zones 910-1 to 910-8. In certain aspects, the first phase zones include clock-switching boundaries of the phase interpolator 610. The first phase zones may also include weight-transition boundaries of the phase interpolator 610.

At block 1130, the phase control signal is adjusted by a first step size upon determining the phase control signal is located within one of the second phase zones. For example, the phase control signal made be adjusted by the phase control circuit 220.

At block 1140, a determination is made the phase control signal is located within one of second phase zones. For example, the determination may be made by the compare circuit 1020. The second phase zones may correspond to the second phase zones 920-1 to 920-8.

At block 1150, the phase control signal is adjusted by a second step size larger than the first step size upon determining the phase control signal is located within one of the second phase zones. For example, the phase control signal made be adjusted by the phase control circuit 220.

In certain aspects, the phase control signal includes a phase control code (e.g., the phase control code pi_ctrl-_code), the first phase zones includes codes for the phase control code, and determining the phase control signal is located within one of the first phase zones includes determining the phase control code matches one of the codes in the first phase zones.

In certain aspects, determining the phase control signal is located within one of the second phase zones includes determining the phase control code does not match any of the codes in the first phase zones.

Implementation examples are described in the following numbered clauses:

1. A system, comprising:
   a phase control circuit having an input and an output, wherein the phase control circuit is configured to output a phase control signal at the output of the phase control circuit;
   a phase interpolator coupled to the output of the phase control circuit; and
   a step-size selection circuit configured to receive a first phase adjustment signal having a first step size, a second phase adjustment signal having a second step size larger than the first step size, and the phase control signal, and wherein the step-size selection circuit is configured to:
   output the first phase adjustment signal to the input of the phase control circuit if the phase control signal is located within one of first phase zones; and output the second phase adjustment signal to the input of the phase control circuit if the phase control signal is located within one of second phase zones.

2. The system of clause 1, wherein the first phase zones include clock-switching boundaries of the phase interpolator.

3. The system of clause 2, wherein the phase interpolator is configured to receive clock signals, and the phase interpolator is configured to:

select a pair of the clock signals at a time based on the phase control signal;

perform phase interpolation on the selected pair of the clock signals; and switch the pair of the clock signals that is selected when the phase control signal crosses one of the clock-switching boundaries.

4. The system of clause 3, wherein the clock signals are evenly spaced apart in phase.

5. The system of clause 4, wherein the clock signals are spaced apart by 90 degrees.

6. The system of any one of clauses 1 to 5, wherein the first phase zones include weight-transition boundaries of the phase interpolator.

7. The system of any one of clauses 1 to 6, wherein the step-size selection circuit comprises:

a multiplexer having a first input, a second input, a select input, and an output, wherein the first input of the multiplexer is configured to receive the first phase adjustment signal, the second input of the multiplexer is configured to receive the second phase adjustment signal, and the output of the multiplexer is coupled to the input of the phase control circuit; and a compare circuit having an input and an output, wherein the input of the compare circuit is coupled to the output of the phase control circuit, and the output of compare circuit is coupled to the select input of the multiplexer.

8. The system of clause 7, wherein the compare circuit is configured to:

compare the phase control signal with the first phase zones; and cause the multiplexer to select one of the first phase adjustment signal and the second phase adjustment signal based on the comparison.

9. The system of clause 8, wherein the phase control signal comprises a phase control code, the first phase zones includes codes for the phase control code, and the compare circuit is configured to cause the multiplexer to select the first phase adjustment signal if the phase control code matches one of the codes in the first phase zones.

10. The system of clause 9, wherein the compare circuit is configured to cause the multiplexer to select the second phase adjustment signal if the phase control code does not match any of the codes in the first phase zones.

11. The system of any one of clauses 7 to 10, wherein the first phase zones include clock-switching boundaries of the phase interpolator.

12. The system of any one of clauses 7 to 11, wherein the first phase zones include weight-transition boundaries of the phase interpolator.

13. The system of any one of clauses 1 to 12, wherein the phase control circuit is configured to update the phase control signal based on the first phase adjustment signal or the second phase adjustment signal output by the step-size selection circuit.

14. The system of any one of clauses 1 to 13, further comprising a data sampler coupled to the phase interpolator, wherein the phase interpolator is configured to output a sampling clock signal to the data sampler, and set a phase of the sampling clock based on the phase control signal.

15. The system of clause 14, wherein the data sampler is configured to receive a serial data signal, and sample the serial data signal on edges of the sampling clock signal to generate data samples.

16. The system of clause 15, further comprising a phase adjuster coupled to the data sampler, wherein the phase adjuster is configured to generate the first phase adjustment signal and the second phase adjustment signal based on the data samples.

17. A method for phase adjustment, comprising:

receiving a phase control signal for a phase interpolator;

determining the phase control signal is located within one of first phase zones;

adjusting the phase control signal by a first step size upon determining the phase control signal is located within one of the first phase zones;

determining the phase control signal is located within one of second phase zones; and adjusting the phase control signal by a second step size larger than the first step size upon determining the phase control signal is located within one of the second phase zones.

18. The method of clause 17, wherein the first phase zones include clock-switching boundaries of the phase interpolator.

19. The method of clause 18, further comprising:

receiving clock signals;

selecting a pair of the clock signals at a time based on the phase control signal;

performing phase interpolation on the selected pair of clock signals using the phase interpolator; and switching the pair of the clock signals that is selected when the phase control signal crosses one of the clock-switching boundaries.

20. The method of clause 19, wherein the clock signals are evenly spaced apart in phase.

21. The method of any one of clauses 17 to 20, wherein the first phase zones include weight-transition boundaries of the phase interpolator.

22. The method of any one of clauses 17 to 21, wherein the phase control signal comprises a phase control code, the first phase zones includes codes for the phase control code, and determining the phase control signal is located within one of the first phase zones comprises determining the phase control code matches one of the codes in the first phase zones.

23. The method of clause 22, wherein determining the phase control signal is located within one of the second phase zones comprises determining the phase control code does not match any of the codes in the first phase zones.

24. The method of any one of clauses 17 to 23, further comprising setting a phase of a sampling clock signal based on the phase control signal using the phase interpolator.

25. The method of clause 24, further comprising sampling a serial data signal on edges of the sampling clock signal to generate data samples.

26. The method of clause 25, further comprising generating the first phase adjustment signal and the second phase adjustment signal based on the data samples.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities. It is also to be appreciated than an "input" may be a single-ended input, a differential input, or one of two inputs of a differential input, and an "output" may be a single-ended output, a differential output, or one of two outputs of a differential output. The term "approximately" means within a range of between 90 percent and 110 percent of the stated value.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
   a phase control circuit having an input and an output, wherein the phase control circuit is configured to output a phase control signal at the output of the phase control circuit;
   a phase interpolator coupled to the output of the phase control circuit; and
   a step-size selection circuit configured to receive a first phase adjustment signal having a first step size, a second phase adjustment signal having a second step size larger than the first step size, and the phase control signal, and wherein the step-size selection circuit is configured to:
      output the first phase adjustment signal to the input of the phase control circuit if the phase control signal is located within one of first phase zones; and
      output the second phase adjustment signal to the input of the phase control circuit if the phase control signal is located within one of second phase zones.

2. The system of claim 1, wherein the first phase zones include clock-switching boundaries of the phase interpolator.

3. The system of claim 2, wherein the phase interpolator is configured to receive clock signals, and the phase interpolator is configured to:
   select a pair of the clock signals at a time based on the phase control signal;
   perform phase interpolation on the selected pair of the clock signals; and
   switch the pair of the clock signals that is selected when the phase control signal crosses one of the clock-switching boundaries.

4. The system of claim 3, wherein the clock signals are evenly spaced apart in phase.

5. The system of claim 4, wherein the clock signals are spaced apart by 90 degrees.

6. The system of claim 1, wherein the first phase zones include weight-transition boundaries of the phase interpolator.

7. The system of claim 1, wherein the step-size selection circuit comprises:
   a multiplexer having a first input, a second input, a select input, and an output, wherein the first input of the multiplexer is configured to receive the first phase adjustment signal, the second input of the multiplexer is configured to receive the second phase adjustment signal, and the output of the multiplexer is coupled to the input of the phase control circuit; and
   a compare circuit having an input and an output, wherein the input of the compare circuit is coupled to the output of the phase control circuit, and the output of compare circuit is coupled to the select input of the multiplexer.

8. The system of claim 7, wherein the compare circuit is configured to:
   compare the phase control signal with the first phase zones; and
   cause the multiplexer to select one of the first phase adjustment signal and the second phase adjustment signal based on the comparison.

9. The system of claim 8, wherein the phase control signal comprises a phase control code, the first phase zones includes codes for the phase control code, and the compare circuit is configured to cause the multiplexer to select the first phase adjustment signal if the phase control code matches one of the codes in the first phase zones.

10. The system of claim 9, wherein the compare circuit is configured to cause the multiplexer to select the second phase adjustment signal if the phase control code does not match any of the codes in the first phase zones.

11. The system of claim 7, wherein the first phase zones include clock-switching boundaries of the phase interpolator.

12. The system of claim 7, wherein the first phase zones include weight-transition boundaries of the phase interpolator.

13. The system of claim 1, wherein the phase control circuit is configured to update the phase control signal based on the first phase adjustment signal or the second phase adjustment signal output by the step-size selection circuit.

14. The system of claim 1, further comprising a data sampler coupled to the phase interpolator, wherein the phase interpolator is configured to output a sampling clock signal to the data sampler, and set a phase of the sampling clock based on the phase control signal.

15. The system of claim 14, wherein the data sampler is configured to receive a serial data signal, and sample the serial data signal on edges of the sampling clock signal to generate data samples.

16. The system of claim 15, further comprising a phase adjuster coupled to the data sampler, wherein the phase adjuster is configured to generate the first phase adjustment signal and the second phase adjustment signal based on the data samples.

17. A method for adjusting a phase of a clock signal, comprising:
   receiving a phase control signal for a phase interpolator;
   determining the phase control signal is located within one of first phase zones;
   adjusting the phase control signal by a first step size upon determining the phase control signal is located within one of the first phase zones;
   determining the phase control signal is located within one of second phase zones; and adjusting the phase control signal by a second step size
larger than the first step size upon determining the
phase control signal is located within one of the second
phase zones.

18. The method of claim 17, wherein the first phase zones
include clock-switching boundaries of the phase interpola-
tor.

19. The method of claim 18, further comprising:
receiving clock signals;
selecting a pair of the clock signals at a time based on the
phase control signal;
performing phase interpolation on the selected pair of
clock signals using the phase interpolator; and
switching the pair of the clock signals that is selected
when the phase control signal crosses one of the
clock-switching boundaries.

20. The method of claim 19, wherein the clock signals are
evenly spaced apart in phase.

* * * * *